(12) United States Patent
Shyr et al.

(10) Patent No.: US 6,472,897 B1
(45) Date of Patent: Oct. 29, 2002

(54) CIRCUIT AND METHOD FOR TRIMMING INTEGRATED CIRCUITS

(75) Inventors: You-Yuh Shyr, San Jose, CA (US); Sorin Laurentiu Negru, San Jose, CA (US)

(73) Assignee: Micro International Limited (KY)

( * ) Notice: Subject to any disclaimer, the term of this patent is extended or adjusted under 35 U.S.C. 154(b) by 0 days.

(21) Appl. No.: 09/489,660

(22) Filed: Jan. 24, 2000

(51) Int. Cl.$^7$ .................. G01R 31/26; H01L 29/00; H03M 1/10

(52) U.S. Cl. .................. 324/765; 257/529; 341/121

(58) Field of Search .................. 324/765, 763, 324/755; 257/529, 530; 323/312, 313, 314; 341/121

(56) References Cited

U.S. PATENT DOCUMENTS

| | | | |
|---|---|---|---|
| 3,890,610 A | 6/1975 | Cahen .................. 340/347 CC |
| 4,150,366 A | * 4/1979 | Price .................. 323/354 |
| 4,225,878 A | 9/1980 | Dobkin .................. 357/51 |
| 4,335,371 A | 6/1982 | Connolly, Jr. et al. 340/347 CC |
| 4,412,241 A | 10/1983 | Nelson .................. 357/51 |
| 4,665,356 A | 5/1987 | Pease .................. 323/314 |
| 4,713,602 A | 12/1987 | Ueda .................. 323/354 |
| 4,823,320 A | 4/1989 | Smayling et al. .......... 365/189 |
| 5,079,516 A | 1/1992 | Russell et al. .............. 330/261 |
| 5,353,028 A | 10/1994 | de Wit et al. ............... 341/172 |
| 5,361,001 A | 11/1994 | Stolfa .................. 327/530 |
| 5,426,616 A | 6/1995 | Kajigaya et al. ............ 365/226 |
| 5,563,549 A | 10/1996 | Shieh .................. 327/543 |
| 5,568,083 A | 10/1996 | Uchiyama et al. .......... 327/538 |
| 5,663,589 A | 9/1997 | Saitoh et al. ............... 257/401 |
| 5,675,280 A | 10/1997 | Nomura et al. ............. 327/538 |
| 5,682,049 A | 10/1997 | Nguyen .................. 257/363 |
| 5,757,264 A | 5/1998 | Petit .................. 338/195 |
| 5,768,290 A | 6/1998 | Akamatsu .................. 371/22.4 |
| 5,771,012 A | 6/1998 | Shu et al. .................. 341/118 |

\* cited by examiner

*Primary Examiner*—N. Le
*Assistant Examiner*—J Kerveros
(74) *Attorney, Agent, or Firm*—Grossman, Tucker, Perreault & Pfleger, PLLC (57) ABSTRACT

A programmable after-package, on-chip reference voltage trim circuit for an integrated circuit having a plurality of programmable trim cells generating a programmed sequence. A converter is provided to convert the bit sequence into a trim current. The trim current is added to an initial value of a reference voltage to be trimmed, as generated by the integrated circuit. Once the correct value of the trim current is determined, isolation circuitry is programmed to isolate the trim circuitry from the remainder of the IC, thereby freeing the logic and package pins associated with the IC for use by users of the IC. The preferred trim circuitry includes fuses which are blown in accordance with a bit value supplied to the trim cell to permanently fix a trim current value, once a best fit value is determined.

16 Claims, 7 Drawing Sheets

CIRCUIT AND METHOD FOR TRIMMING INTEGRATED CIRCUITS

BACKGROUND OF THE INVENTION

1. Field of the Invention

The present invention relates to a circuit and method for trimming integrated circuits, and more particularly, the present invention relates to a circuit and method for trimming packaged integrated circuits without requiring additional package pins or logic to accomplish same. Particular utility for the present invention is in trimming a reference voltage associated with a mixed-signal IC; although the present invention is equally applicable for any IC where a precise reference voltage is desired: for example, accurate voltage controlled oscillator, high precision DAC, accurate current generator, etc.

2. Description of Related Art

In manufacturing analog (mixed signal) integrated circuits, the basic building blocks are usually not accurately controlled by the manufacturing process as may be desired. For example, capacitors and resistors may have the wrong value, and MOS transistors may have the wrong gain setting. There are too many variables in the manufacturing process to yield absolute predictable results. Yet historically analog circuits often require very accurate voltage references, frequency references, and accurately ratioed elements.

To compensate for the process variability, many electronic circuits use analog trimming during test to set resistor values as necessary for proper operation of the circuit. A typical trimming technique utilizes a resistor ladder comprising a series of serially coupled resistors each in parallel with either a fuse or anti-fuse. A fuse is a device that is substantially an electrical short until it is blown open. An anti-fuse is an electrical open until blown when it becomes substantially an electrical short.

The fuse-blowing approach may take several forms, each with its own shortcomings. Laser fuses may be used directly across each resistor element in the ladder to enable and disable conduction through the resistor. During test, certain resistors are selected to open the shunt element thereby adding resistance to the serial path. The resistor ladder should be adjustable at wafer test over a range from say 10 to 2,560 ohms in 10 ohm increments.

The analog trimming may be performed iteratively, i.e. test, trim, test, trim, to measure the effect of the course trim and determine the necessary fine trimming. For iterative trimming, a laser trim system is typically installed on the wafer tester to alternately test and trim. However, one laser system per tester is very expensive. The laser is often in an idle state waiting for the tester. Moreover, if either the test system or laser breaks down both are inoperative.

An alternate approach is to use a zener anti-fuse across the resistor ladder. Such an element can be cheaply trimmed on the tester so that iterative testing can be done in one pass on the tester. Zener anti-fuses require large voltage to program. Such a voltage placed on the chip can affect the rest of IC especially for low voltage operation. Therefore, each anti-fuse requires its own external pad and probe card needle. This restricts the programming bit count to say 5–10 bits before the die area for test pads and complexity of the probe card requirements become prohibitive.

In general, iterative testing is a slow and expensive process. Consequently, many trimming techniques utilize only a single pass to evaluate which resistors in the serial string should be included to achieve the desired analog circuit operation. Thus, as result of a test measurement, the user blows the shunt fuse elements whereby the circuit is expected to operate as planned. The process of blowing the fuses typically involves laser trimming off-line from the test set to cut the poly material and open the shunt element. The circuit may be returned to the test set to verify proper trimming. If the subsequent testing should fail, the part is typically discarded since it is difficult to patch the shunt fuse elements.

Moreover, these processes are performed at a wafer level, i.e., before packaging of the IC and require probe cards, long cables, etc., which is a labor and time intensive task for each IC. During the packaging process (e.g., die, cut and ceramic or plastic encapsulation), the IC is subject to mechanical and chemical stress which can again alter the components that have been trimmed by the wafer trimming processes, rendering wafer-trimming an unattractive alternative. One partial resolution to wafer-level trimming procedures can be found in U.S. Pat. No. 5,079,516, issued to Russell et al. This patent discloses an after package (i.e., post-assembly) trimming circuit and method for a LF155 BIFET® monolithic JFET input operational amplifier, that operates to correct any discrepancies of a wafer trimming process performed before packaging of the IC. The type of JFET IC described in this patent includes balance package pins (38 and 39, FIG. 2) which are normally used to attach an external potentiometer to adjust the offset voltage after packaging. The '516 proposes, however, the addition of on-chip trim circuitry which effects an internal trim procedure, utilizing the balance pins already provided. The '516 also isolates the balance pins from the rest of the circuit after trimming, so that the trim value cannot be altered by an accidental input on the balance pins by the user. However, once trimmed the balance pins remain inactive, and cannot, by design be utilized by the IC. Thus, the balance pins remain as wasted real estate space on the IC, an important consideration when minimizing package pins and chip "real estate". Additionally, newer JFET IC of the type described in the '516 patent do not have external balance pins, and thus, cannot use the trim process proposed in the '516, and must instead rely on wafer-level trimming processes. Thus, if the '516 patent were to be modified with newer IC packages, the trim circuitry described therein would necessarily require additional package pins that would be only used for trimming.

Additionally, conventional trimming process using fuses and/or zener diode require significant input current to effectuate blowing the fuse or zapping the diode. It is recognized that the requirement of high current in an IC requires additional measures to ensure that other components remain isolated from high current conditions. Additionally, such high current places large power requirements on the IC, which is undesireable.

Therefore, there exists a need to provide an on-chip, after-package trim circuit which does not require additional external package pins can utilize package pins of the IC and which relinquishes the package pins after trimming, for use as proscribed by the IC. A need also exists to provide a trim circuit adapted to be isolated from the remainder of the IC, so that the functionality of the IC is not compromised and so that additional components need not be incorporated into the IC to effectuate the trim process. There also exists a need to provide a trim circuit and methodology that is dynamically designed, and insensitive to varying chip-to-chip tolerances of the components incorporated into the IC.

SUMMARY OF THE INVENTION

Accordingly, it is one object of the present invention to provide an after package integrated circuit trim circuit and method which utilizes fuses for setting a trim voltage.

It is another object of the present invention to provide an after package integrated circuit trim circuit and method which does not require additional pins to accomplish a trimming procedure.

The present invention accomplishes these and other objects by providing a programmable after-package, on-chip reference voltage trim circuit for an IC. The programmable trim circuit includes a register being controlled to generate a sequence of test bit signal and a sequence of set bit signals. A plurality of programmable trim cell circuits are selectively coupled to the register, and each cell receives a test bit signal and set bit signal from the register. The trim cells are adapted to generate output signals equal to said test bit signal or said set bit signal, respectively, supplied to each trim cell. A digital to analog converter (DAC) circuit is coupled to the output signals and generates a trim current signal proportional to the output signals. The trim current is injected into a resistor placed between trim current generator and voltage reference block. A trim voltage signal, with sign and magnitude is now available for adjusting the initial, fixed, voltage reference value. It is added to an initial value of a reference voltage generated by said IC.

In the preferred embodiment, the trim cell circuits include an OR gate having a first input and a second input, the second input being selectively coupled to said test bit signal. The trim circuits also include a set circuit portion including a first switch having a control node selectively coupled to the set bit signal and a conduction node, a second switch having a control node coupled to said conduction node of the first switch, an active node coupled to a common voltage rail supplied by said IC and a conduction node coupled to the first input of the OR gate. A nominal current source is provided in parallel with said second switch and connected to the first input of the OR gate and the voltage rail. A fuse is coupled between a ground potential rail supplied by the IC and the first input of the OR gate. The set bit signal controls the conduction state of the first and second switches, and the input value of the first input of the OR gate.

In operation, the preferred trim circuit operates as follows: if the set bit is high, both the first and second switches conduct and a conduction path between the voltage rail and ground is established through the fuse causing said fuse to break, and thus the voltage rail is permanently coupled to the first input of said OR gate; and if the set bit is low, both the first and second switches do not conduct and the fuse remains intact, and a conduction path is established between the voltage rail and ground through the fuse and the current source thereby generating a low input to the first input of the OR gate.

In method form, the present invention provides method of trimming a reference voltage for an integrated circuit comprising the steps of: measuring an initial value of a reference voltage signal generated by the IC; comparing the initial value signal to a high precision reference signal; generating a control signal indicative of the sign of difference between the initial value signal and the high precision signal; controlling a plurality of trim cell circuits to generate a bit sequence indicative of a sign and magnitude of a trim current; generating a trim current having a sign and value proportional to the bit sequence; generating a trim voltage by applying the trim current into a resistor placed between trim current generator and voltage reference block; adding the trim voltage to the initial value signal and determining if the added signals approximately equal the high precision reference signal; and permanently setting the bit values generated by the trim cells when the added signals equal the high precision reference signal. The preferred method also includes the step of electrically isolating the trim cells from the IC after the step of permanently setting said bit values.

It will be appreciated by those skilled in the art that although the following Detailed Description will proceed with reference being made to preferred embodiments and methods of use, the present invention is not intended to be limited to these preferred embodiments and methods of use. Rather, the present invention is of broad scope and is intended to be limited as only set forth in the accompanying claims.

Other features and advantages of the present invention will become apparent as the following Detailed Description proceeds, and upon reference to the Drawings, wherein like numerals depict like parts, and wherein:

DETAILED DESCRIPTION OF PREFERRED EMBODIMENTS

FIGS. 1–4 depict detailed circuit diagrams of an exemplary reference voltage trimming circuit of the present invention. Before discussing in detail the trimming circuitry and methodology of the present invention, it should be noted that the IC 10 includes common components that are utilized herein. As will be understood by those skilled in the art, mixed signal IC packages generally include package pins that are directed to the overall functionality of the IC. The particular functionality of the IC is not important to the present invention, but may include D/A and A/D converter circuits, Op Amps, VCO circuits, etc. In the examples shown in FIGS. 1–4, the package pins utilized herein include VDD 28 (e.g., common voltage rail), GND 26 (e.g., ground) and an internal reference voltage VREF that is generated by the IC that has a value and accuracy for a particular application (i.e., functionality) of the package. Mixed-signal IC packages also typically include I/O signal lines and package pins to operable with an internal bus controller (which, in the present example, is an SMBUS IC controller 42) for controlling I/O signal lines (i.e., data bus) and/or common bus pinouts bus pins, SMBCLK 22 and SMBDATA 24. The bus (SMBCLK 22 and SMBDATA 24) depicted in FIGS. 1–4 is shown as an I²C bus configuration, but may alternatively be a PCI bus configuration, USB, 1394, etc., or other bus configurations known in the art. The particulars of the bus are not important to the present invention, provided that the bus can be used to control and address an internal register 12 associated with the IC 10. It should be noted at the outset that the example shown in FIGS. 1–4 is directed to trimming the reference voltage, as found on the VREF pin 56. The present invention is intended to provide after-package reference voltage (VREF) trimming circuitry and methodology which does not require additional pins, and further, which utilizes the internal register 12 only for the trimming procedure, and upon completion, releases the register for use by the IC. Additionally, the trim circuitry includes isolation circuitry to release the package pins utilized during testing, so that the package pins can be used by the IC as intended. These components set out above will be referred to herein, and should be recognized as being common to IC packages, regardless of the functionality of the IC.

Preferably, the reference voltage trim circuitry of the present invention is programmable to provide a best-fit trim value, and includes fuses to permanently set the best-fit value. As an overview, the present invention comprises three main operations: 1) determination of an initial value of an IC reference voltage (V0) and comparing that value with a known, high-precision reference signal to determine the offset of reference voltage, 2) programming trim circuitry with a bit count to generate a trim current, to convert it into a trim voltage and increment (add or subtract) the reference voltage (V0) with the trim voltage to obtain a reference voltage to within a predetermined tolerance, and 3) permanently fixing the value of the trim signal (and thus, the reference voltage), and isolating the trim circuitry from the internal IC register and the package pins. Each of these operations, and the preferred circuitry to accomplish same, are discussed separately below.

Test Interface Circuitry and Measurement of V0

For clarity the initial reading of VREF shall be referred to herein as V0. To measure the IC reference voltage V0, and for controlling the IC, via I/O lines 22, 24, to implement a test procedure, a test interface 50 is provided. The test interface includes a high precision comparator 52 that compares the IC reference voltage VREF (V0) to an internally generated, high precision reference signal Vref 72, generated by generator 54. To accurately define the amount of trimming necessary for VREF, it is preferable that the signal generator 54 generates a reference signal 72 having an accuracy greater than the desired resolution of VREF. The comparison of the high precision reference signal Vref 72 and the reference signal V0 56 (at comparator 52) generates a control signal 58, indicative of the sign of V0 with respect to Vref. The test interface circuitry preferably also includes a bus controller 62, that is appropriately adapted to write data to the bus controller 42 (via I/O lines 22, 24). The bus test controller 62 is provided to interface with bus controller 42 (internal to the IC) for controlling read/write operations to register 12, as will be described below. The test interface also preferably includes a voltmeter 60 to monitor the incremental adjustments made to V0 during the trimming procedure (as will be described below). Once the control signal 58 is initially determined, it is used to control the test controller 62. By convention, it will be assumed herein that if V0>Vref, the control signal 58 will be negative (−), indicating that the trimming must reduce the value of V0. Likewise, if V0<Vref, the control signal 58 will be positive (+), indicating that trimming must increase VREF (V0). Once V0 is determined, test controller 62 (belonging to test interface 50) will command controller 42 (belonging to IC 10) based on the value of control signal 58, to begin the trim test procedure, described below.

Figure 4:
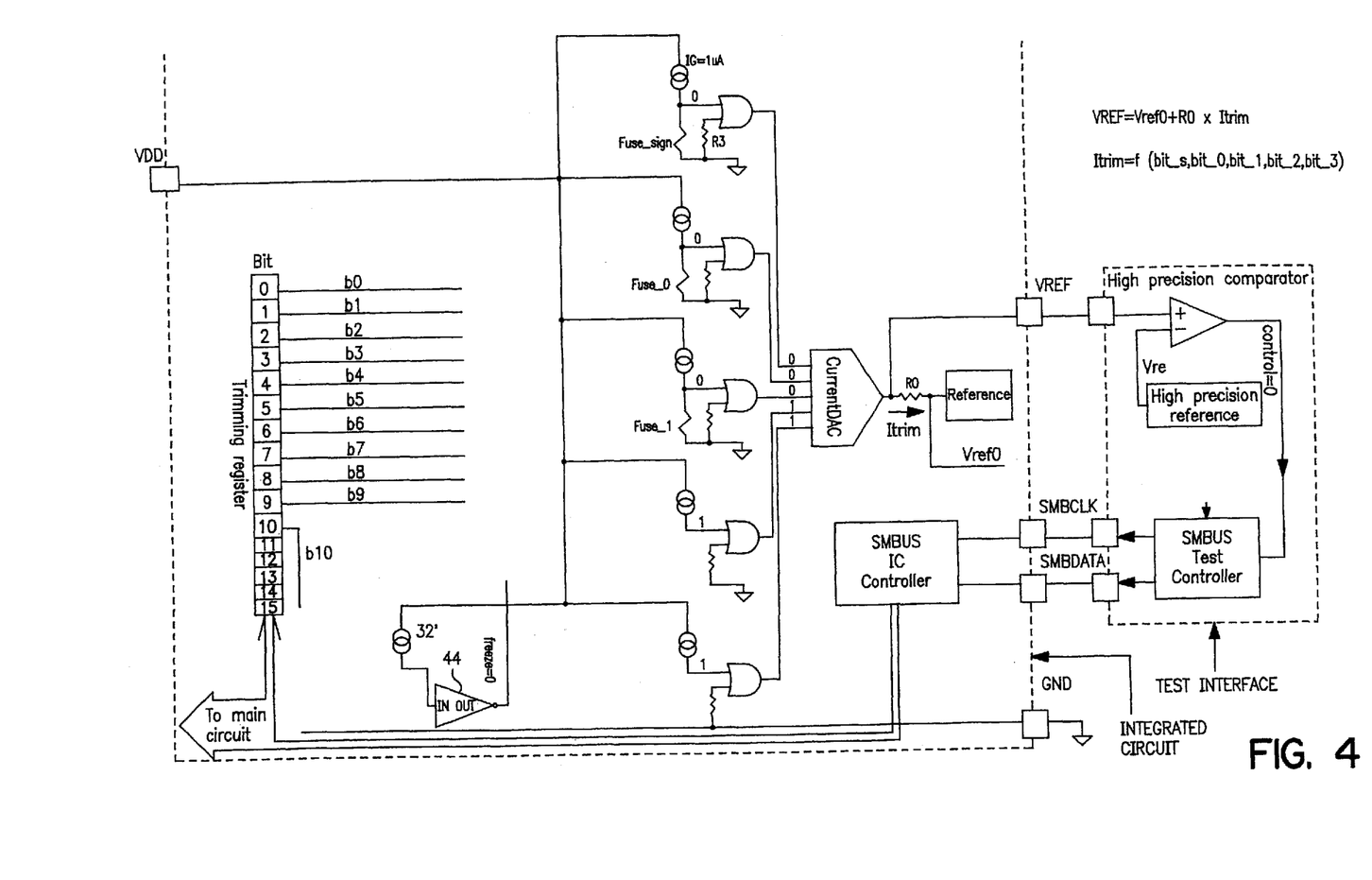
FIG. 4 is a detailed circuit diagram depicting an exemplary fuse burning procedure to isolate the trimming of the circuit of FIG. 1.
Figure 5A:
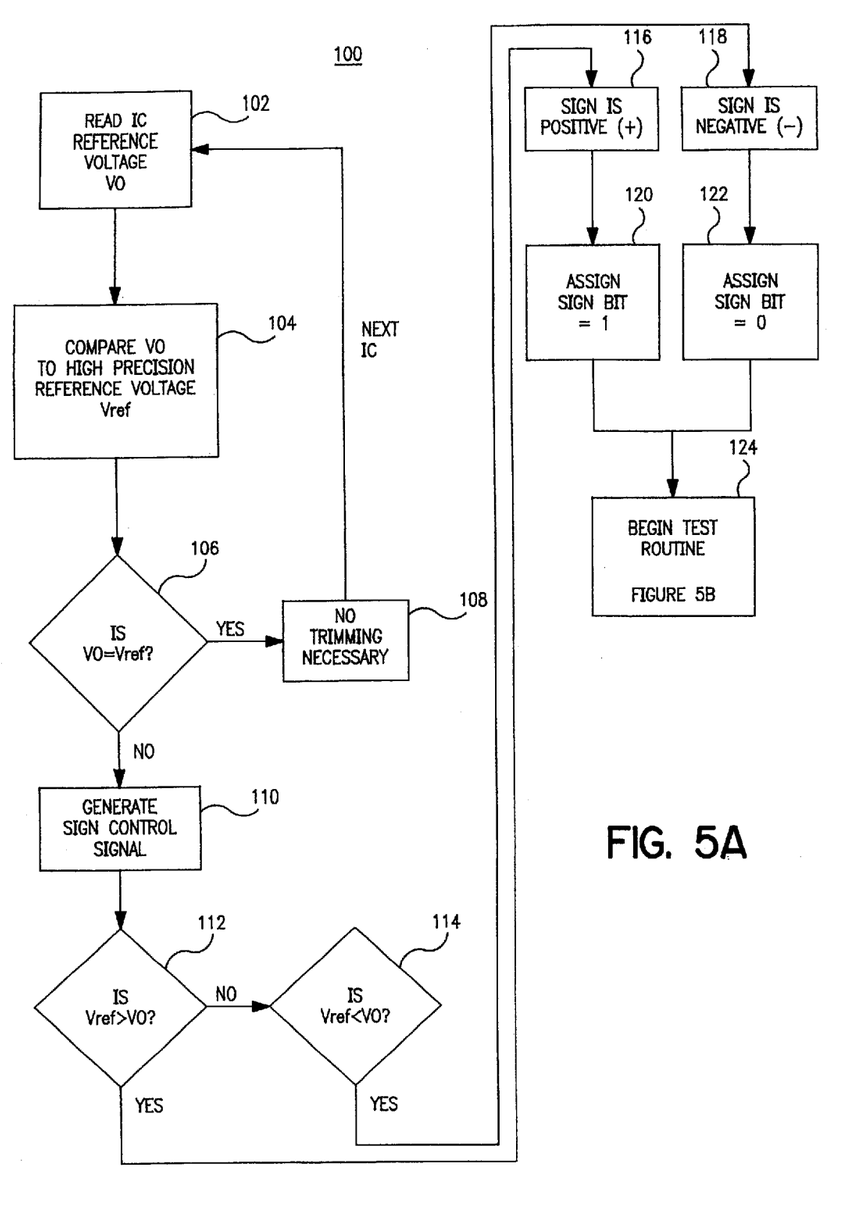
FIGS. 5A, 5B and 5C are flowcharts of the preferred reference voltage trimming process of the present invention.
Figure 5B:
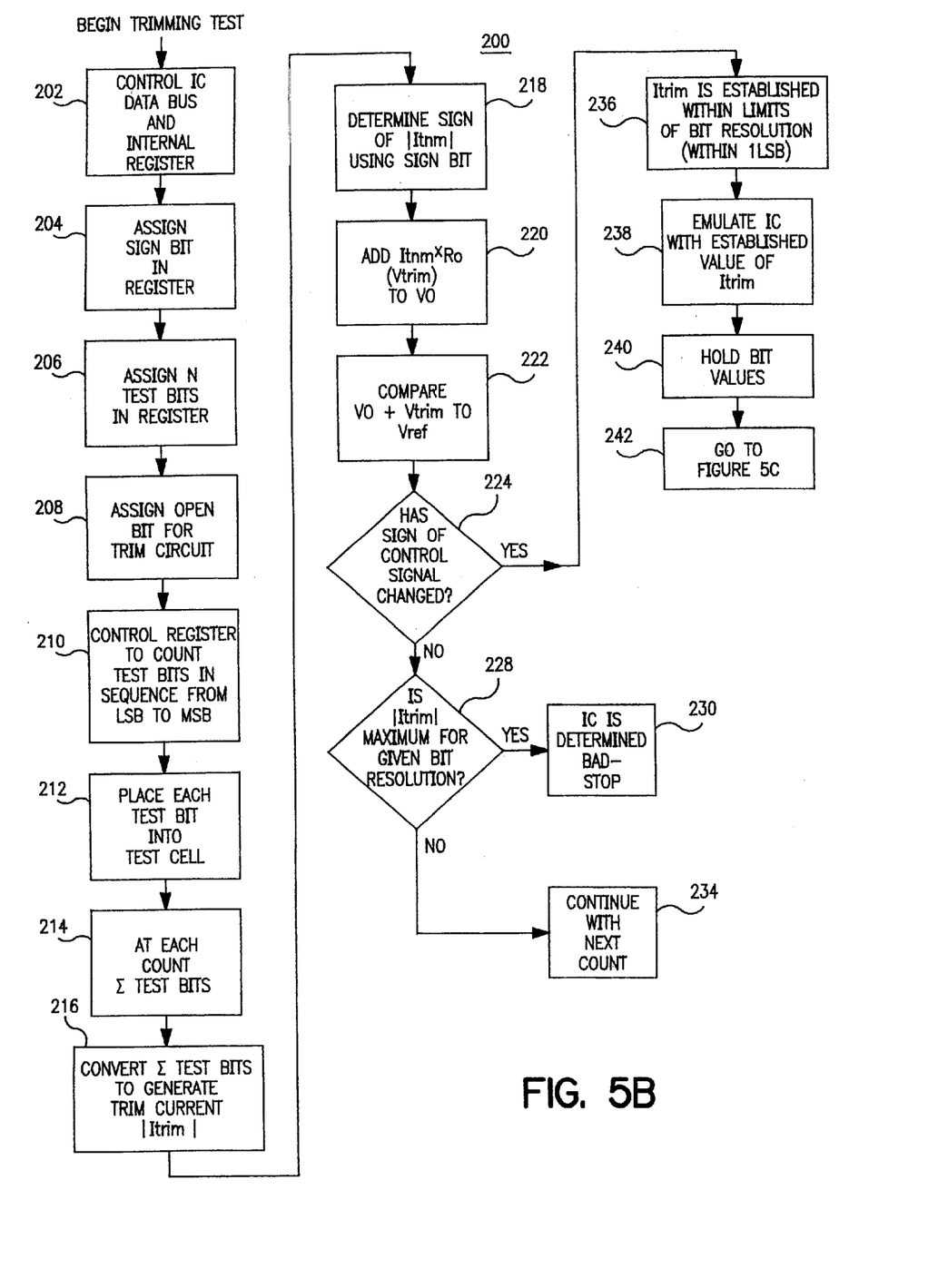

FIG. 5a depicts the preferred flowchart 100 for the initial reading of V0, and the determination of the sign of control signal 58. For clarity, those components set forth in FIGS. 1–4 (i.e., test interface 50 including comparator 52 and high precision reference signal generator 54) will be referred to below without reference numerals. Initially, the test interface takes a reading if the initial value of the IC reference voltage V0 102. The test interface compares V0 to a high precision reference voltage Vref 104. To generate the control signal 110, a comparator determines if Vref>V0 112, or if Vref<V0 114. If Vref>V0, the test interface concludes that a trim voltage must be added to V0, and thus the sign of the sign control signal is positive (+) 116. Conversely, if Vref<V0, the test interface concludes that a trim voltage must be subtracted from V0, and thus the sign of the sign control signal is negative (−) 118. If 116, the test interface controls an internal IC register to assign a sign bit=1 120, indicating that the sign of the trim voltage is to be positive. If 118, he test interface controls an internal IC register to assign a sign bit=0 122, indicating that the sign of the trim voltage is to be negative. In either case, the controller begins the test procedure, as to trim the reference voltage V0 to within a predetermined threshold, the preferred process of which is depicted in FIG. 5B (described below).

Bit Count Trimming and Preferred Trim Circuitry

Turning now to the on-chip trim circuitry, and as an overview, the preferred arrangement includes a sign designation trim cell 14A, and a plurality of trim cells 14B, 14C, 14D and 14E that are selectively coupled to an IC register 12. Each trim cell defines one bit, from LSB to MSB, of a bit count. Test cell 14A is designated as the sign bit generating cell, whose value remains constant during the bit count procedure herein described. An additional cell 16 is provided to control access and isolation of the test cells 14A–14E. For manufacturing ease and overall repeatability, it is preferred that the cells 14A–14E and 16 be substantially identical (except as more fully described below). Each trim cell 14A–14E has two inputs from the register 12: a test input (T) and a set input (S). Accordingly, each trim cell 14A–14E preferably includes a test circuitry and set circuitry. Control cell 16 has a single input from the register 12 (designated as OPEN). During the bit count, the register 12 supplies test cells 14B–14E with the current bit count on each respective bit test line T. Preferably, during the test procedure, the register holds the set circuitry of each trim cell inactive by supplying a bit value of 0 thereto, until the proper best fit bit values have been determined and the best fit values have been simulated. The preferred circuit arrangement for trim cells 14A–14E is described more fully below.

Each test cell 14A–14E preferably includes an OR gate 30, a current source 32 and a transistor pair MN 36 and MP 34, and a fuse 48. Each test cell is adapted to perform a test procedure and a set procedure. To that end, in the preferred embodiment of FIGS. 1–4, each test cell includes test circuitry and set circuitry. The transistors, current source and fuse are coupled to a set bit input (S) from the register 12 and to the OR gate. During the test operation, the set bit input is held low, so that this circuitry remains inactive. For testing, the test bit signal T is directly coupled to the OR gate (via transfer gates 38) from the register, which are generated by the controller 42. Resistors R1, R2 are provided as bias resistors for the transistors MN and MP, as is understood in the art, and are not essential to understanding the present invention. Likewise, resistor R3 is provided to prevent a floating condition at the OR gate 30 when the fuse is blown. The transistors are used once the correct bit value for that cell has been determined, for blowing the fuse 48 associated with each cell, the operation thereof is set out below with reference to FIG. 3. Transistor MN 36 preferably comprises a low-power nMOS transistor that is controlled by the set bit (bit S output from register 12). The drain of MN is coupled to the IC voltage source VDD 28 (via biasing resistor R2), and to the gate of MP 34. Transistor MP preferably comprises a high-power pMOS transistor having its source coupled to VDD and it's drain coupled to the OR gate 30. Also coupled to the source of MP (and to the drain of MN), a current source IG is provided, which is likewise coupled to the OR gate 30, as shown, and to the fuse 48. MP is provided in parallel with IG, and both are coupled to the fuse and ground GND 26. Preferably, fuse 48 comprises a metal or polysilicon resistor. Most preferably, the fuse 48 is blown by electrical overstress, for example, having a maximum electrical stress (i.e., rating) value of 1A/5V for metal type resistors or 0.1A/5V for polysilicon. As is understood, the value of the fuse 48 is not limited to the above-example, and all such fuse types known in the art are deemed within the scope of the present invention. Accordingly, the current source 32 preferably generates a current having a value several orders of magnitude smaller than required to blow the fuse 48 (for example, a 1A is sufficient for most applications).

During the trim process, controller 62 of the test interface 50 commands controller 42 of the IC 10 (via, e.g., I/O lines SMBCLK and SMBDATA) to take control of internal register 12 and begin a bit counting procedure on those bits that have been designated as test bit (T) signal lines. Additionally, the test bit input into the sign designation trim cell 14A is held constant, and is not part of the bit count sequence. The sign bit T supplied to test cell 14A is determined by control signal 58, described above. The remaining test cells, 14B–14E, receive input data from register 12 (via test signal lines T) reflective of the bit count sequence. It is preferred that the bit count proceeds from the LSB to the MSB. Thus, the bit count during the test procedure proceeds from 0001, 0010, 0011, 0100, . . . , 1111 (i.e., LSB to MSB) for a 4-bit resolution trimming procedure. In the examples shown, at each bit count, test bits 3, 5, 7 and 9 (in register 12) will be incremented. Those skilled in the art will recognize that there is no particular significance associated with the choice of these particular bits, but is only provided as an example. Moreover, those skilled in the art will recognize that any number of test cells can be provided to achieve a desired resolution, and the circuit diagrams depicted in FIGS. 1–4 are merely shown as an example.

At each counting step, the test cells pass each bit value through to OR gate 30. The output signals of each OR gate are input into a current D/A converter, current DAC 18. The bit values are summed and converted into trim current, Itrim, utilizing the current DAC 18. A voltage drop Vtrim 70 is added to the initial reference value V0 to produce VREF. Accordingly, VREF is defined as function of VO (the initial value of VREF) and the addition of the trim voltage, Vtrim (i.e., VREF=f(V0+Vtrim)). To that end, trim resistor RO is provided and coupled to Itrim, for generating Vtrim. The value of RO is not important, provided that it remains constant throughout the procedure. The current DAC 18 provides an analog current Itrim, whose absolute value is a function of the test bits: bit_0, bit_1, bit_2 and bit_3 (output from test cells 14B, 14C, 14D and 14E, respectively). The sign of Itrim is determined by bit_s, which is proscribed by the control signal 58, described above.

Initially, the test cells 14A–14E are opened to accept data from the register 12, via cell 16. Cell 16 (herein referred to as the OPEN/ISOLATE cell) controls the OPEN signal line 40. Coupled between each input date line T and S from register 12 and each cell 14A–14E, a plurality of transfer gates 38A–38E are provided. The transfer gates 38A–38E are controlled by the OPEN signal line 40. During the test and set procedures, the OPEN signal line controls gates 38A–38E so that data from register 12 is permitted to flow into the test cells 14A–14E. To accomplish this, cell 16 has a configuration similar to test cells 14A–14E, but operates on a single input OPEN, and further includes an inverter 44. During the test and set procedure, the OPEN bit is held low, so that the output of the inverter is HIGH, thus opening the transfer gates 38A–38E.

Figure 1:
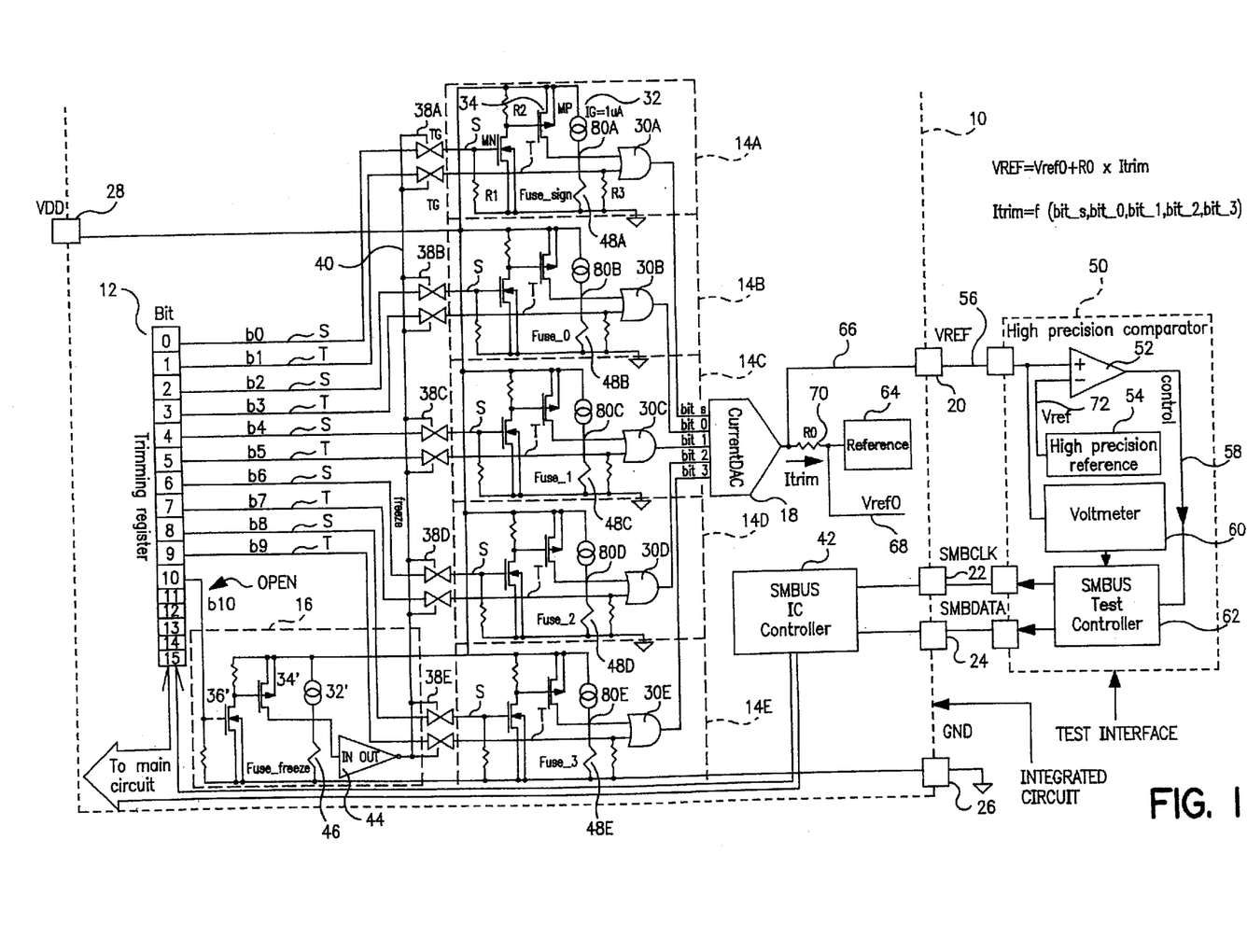
FIG. 1 is a detailed circuit diagram of an exemplary reference voltage trimming circuit of the present invention.
Figure 2:
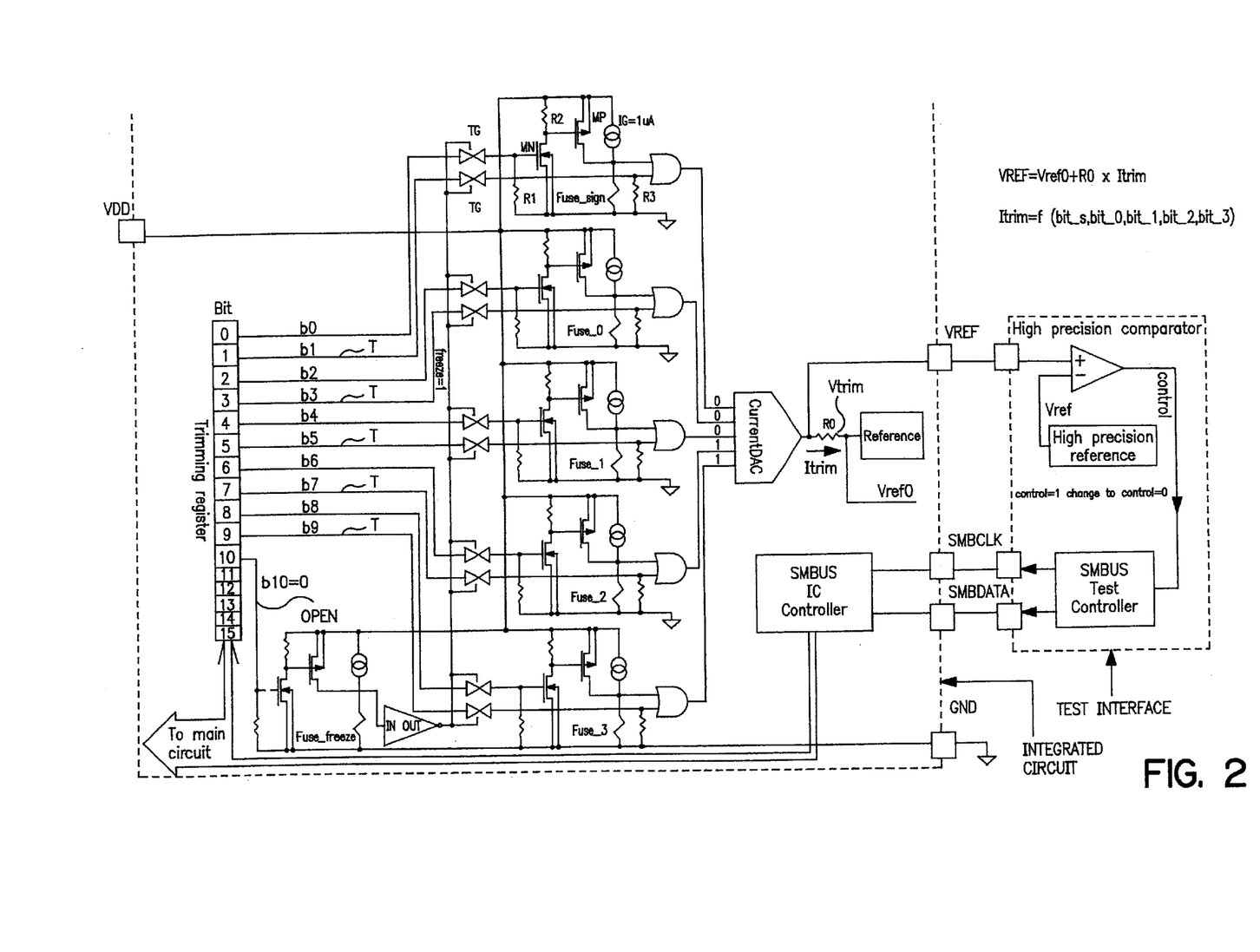
FIG. 2 is a detailed circuit diagram depicting an exemplary test procedure of the circuit of FIG. 1.

In the example of FIGS. 1–4, it will be assumed that sign signal 58 is determined to be negative (i.e., V0>Vref), and thus, will dictate that the current Itrim (and hence the trimming voltage Vtrim) be negative, and that the negative value Itrim be summed with V0. By convention, for current DAC to produce a negative current, the sign bit is 0. Thus, controller 62 commands controller 42 to ensure that the register has a bit value of 0 for the test bit signal line T (bit 1 in the drawings) associated with cell 14A throughout the entire test procedure. Referring now to FIG. 2, assume that the trimming test procedure has been underway, and that test bits 3, 5, 7 and 9 have values of 0, 0, 1 and 1, respectively. The current DAC will generate a current Itrim based and these bit values (which generates a proportional trimming voltage Vtrim across resistor R0). Vtrim is added to V0 and again compared to Vref, at comparator 58. This is done for each bit count in the sequence. Note that bit 1=0, and thus Itrim is negative, and thus Vtrim is negative. If the comparison generates a control signal 58 that has changed sign (e.g., VREF is now less than Vref), then it is determined that Vtrim has been established to within the threshold of 1 LSB. Controller 62 commands controller 42 to stop the bit count sequence and hold the current bit sequence in the register, for emulation and setting.

In the example shown, assume the correct bit sequence is determined as being 0, 0, 1, 1 for test cells 14b, 14C, 14D, and 14E, respectively (See FIG. 2). For test cell 14A it is determined that Vtrim should be negative, and thus cell 14A generates a 0 value. This is only an example, and is not to be construed as limiting the present invention to this particular bit sequence.

FIG. 5B depicts a flowchart 200 for the preferred trim test procedure for obtaining the value of the trim voltage Vtrim. For clarity, those components set forth in FIGS. 1–4 (i.e., test interface 50 including comparator 52 and high precision reference signal generator 54, and the trim components associated with the IC 10 including the trim cells 14A–14E, isolation cell 16, register 12 and transfer gates) will be referred to below without reference numerals. Once the sign of the sign control signal 58 has been determined, the test procedure begins by controlling the IC data bus and internal register 202 to begin a bit count procedure. A sign bit, reflective of the sign of the sign control signal, is assigned in the register 204. According to a predetermined desired resolution (i.e., bit-depth), a plurality (n) of test bits are assigned in the register 206. To access the trim cells circuits, an OPEN bit is assigned in the register 208, which couples the trim cells to the register. The register is controlled to begin a count of the test bits in order, from LSB to MSB 210. At each count, each test bit is placed into a corresponding trim cell 212. At each count, the test bits are summed 214, and the summed test bits are converted to generate a trim current, Itrim, 216. At step 216, the absolute value of Itrim is determined. The sign of Itrim is determined using the sign bit 218. Itrim is input into a resistor (R0) to generate a voltage drop, Vtrim (=Itrim×R0), proportional to Itrim. Itrim×R0 (Vtrim) is added to V0 220. A test interface reads V0+Vtrim, and compares V0+Vtrim to the high precision reference voltage Vref 222. The test interface determines if control bit of test interface, changes the value. If so, at this point, these bit values are emulated and the trim circuitry is isolated from the register, as set out below with reference to FIG. 5C. If not, the test interface determines if Itrim is maximum for the given bit resolution 228. If so, the IC is determined bad and the procedure stops 230. If not, then it is known that the current bit count has not achieved a correct value for Itrim, and the process repeats with the next count 234. If the sign of the control signal has changed, it is determined that Itrim is established to within the limits of the predetermine bit resolution (n) (i.e., to within one LSB) 236. With these bit values, the IC is emulated to ensure that Itrim still produces the correct trim voltage Vtrim 238. The test interface holds these bit values in memory 240, which are used to set the trim cells (described below with reference to FIG. 5C 242).

Setting the Trim Value and Isolating the Trim Circuitry

Figure 3:
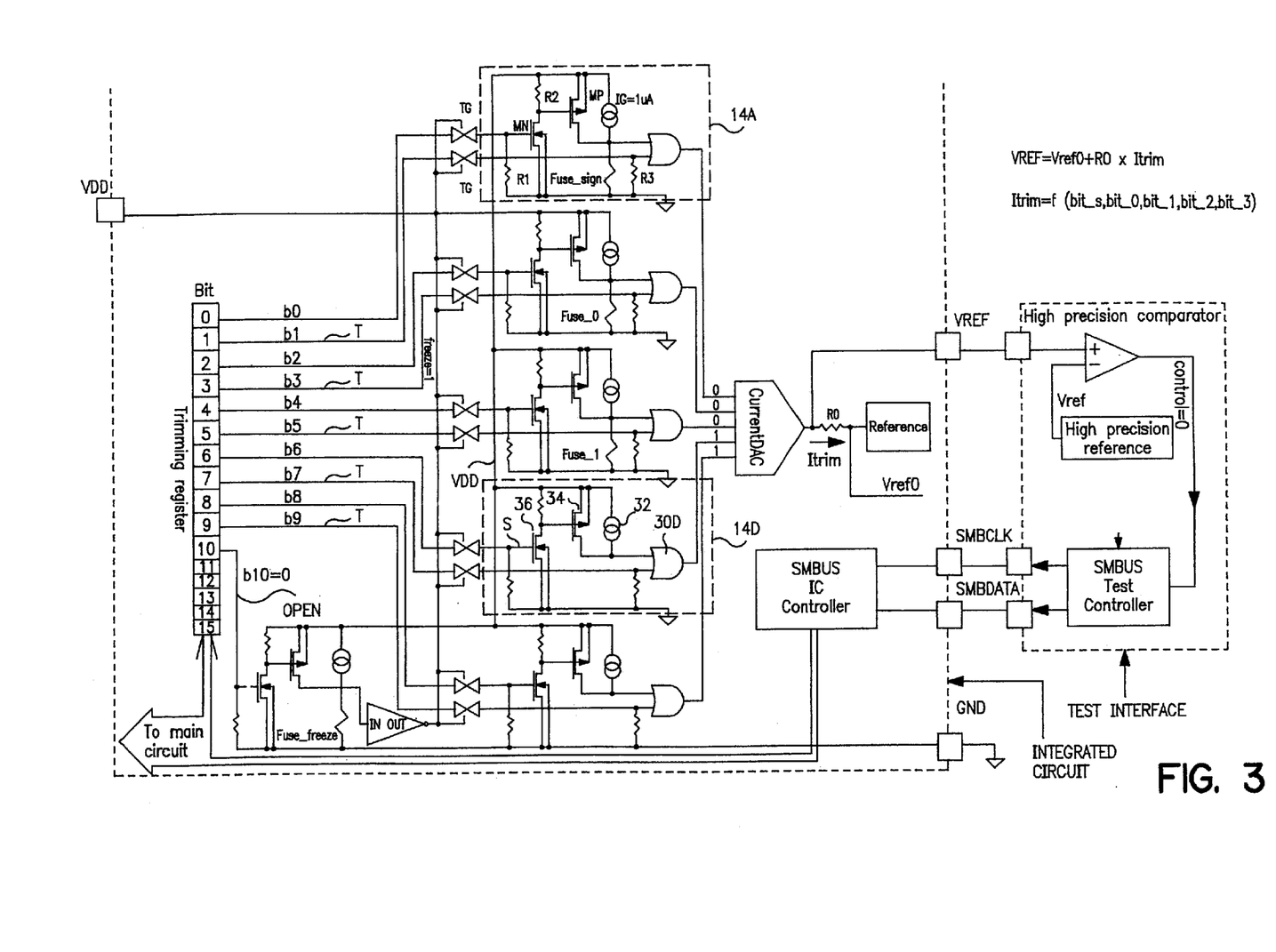
FIG. 3 is a detailed circuit diagram depicting an exemplary fuse burning procedure to set the reference voltage of the circuit of FIG. 1.

Referring now to FIG. 3, and assuming that the correct bit sequence has been determined and emulated, controller 62 commands controller 42 to shift, in the register 12, the test bits to the corresponding set (S) bit lines for each trim cell. In the example shown, bits 0 and 1 are input as set (S) and test (T) bits into test cell 14A, bits 2 and 3 are input as set (S) and test (T) bits into test cell 14B, and so on for test cells 14A–14E, as shown. Thus, in this example, bit 1 is shifted to bit 0, bit 3 is shifted to bit 2, bit 5 is shifted to bit 4, and so on, for test cells 14A–14E. By shifting the bits as shown, the set circuitry associated with each test cell is activated. As an example, the operation of the preferred set circuitry is described below. At the outset, it is to be understood that if a particular bit in the test cell is 1, the fuse for that bit will blow, thus permanently setting the output of that cell to 1. Likewise, if a particular bit in the test cell is 0, the fuse for that bit will not blow, thus permanently setting the output of that cell to 0.

Set Bit=1

In FIG. 3, the following description centers around test cell 14D, which has a set bit (S) value of 1, as shown. It is assumed that controller 62 commands controller 42 to hold the OPEN signal line 40 in a conductive state, via cell 16 and the OPEN bit input from the register 12, thereby permitting the test cells to receive data input from the register 12 via transfer gates 38. It is also assumed that the test bits have been shifted to the set bits. As is shown, the set bit is input into the gate of switch (e.g., transistor) MN 36, which turns MN 36 ON (i.e., conducting). The drain of MN 36 is coupled to VDD (via biasing resistor R1) and to the gate of switch MP 34. Since the drain of switch 36 is conducting VDD, and since the drain is coupled to the gate of switch MP 34, switch 34 is likewise conducting. Thus, a conduction path is established from VDD, through MP34, through Fuse_2 (FIGS. 1 and 2), to ground GND. Fuse_2 has a rating less than VDD, thus Fuse_2 is blown, as shown in FIG. 3. Current source 32 is coupled to VDD and to OR gate 30, in parallel with switch 34. A similar operation occurs at test cell 14E, whose set bit is also equal to 1, thereby blowing Fuse_3.

Set Bit=0

In FIG. 3, the following description centers around test cell 14A, which has a set bit (S) value of 0, as shown. Recall that test cell 14A controls the sign of Itrim, via the current DAC 18. It is assumed that controller 62 commands controller 42 to hold the OPEN signal line 40 in a conductive state, via cell 16 and the OPEN bit input from the register 12, thereby permitting the test cells 14A–14E to receive data input from the register 12 via transfer gates 38. It is also assumed that the test bits have been shifted to the set bits. As is shown, the set bit is input into the gate of switch (e.g., transistor) MN 36, and, since the set bit S=0, MN 36 OFF (i.e., not conducting). The drain of MN 36 is coupled to VDD (via biasing resistor R1) and to the gate of switch MP 34. Since the drain of switch 36 is not conducting and since the drain of switch 36 is coupled to the gate of switch MP 34, switch 34 is likewise in a non-conducting state. Thus, no conduction path is established from VDD, through MP34, through Fuse_sign (FIGS. 1 and 2), to ground GND. Moreover, since the current source 32 is in parallel with MP, the current source is only conducting a nominal amount of current, insufficient to blow Fuse_sign. Thus, fuse_sign remains intact, and supplies a conduction path to ground for the current source. Thus, both inputs to the OR gate 30 remain low, and hence, the output is low. A similar operation occurs at test cells 14B and 14C, whose set bit is also equal to 0, and thus, Fuse_0 and Fuse_1 remain intact.

Once the appropriate fuses have been blown, or left intact, as described above, the preferred embodiment implements an isolation procedure to free the internal register 12 for other purposes, so that an additional register need not be dedicated only to the trimming procedure, and for permanently isolating the test cells so that the trim value obtained therefrom does not change. Accordingly, and referring now to FIGS. 1, 3 and 4, test controller 62 commands bus controller 42 to change the sign of the OPEN bit coupled to cell 16, in register 12. Before discussing the preferred isolation operation, a brief description of cell 16 follows. Cell 16 preferably includes an nMOS transistor 36', a pMOS transistor 34', a current source 32', a fuse (Fuse_freeze) and an inverter 44. (It should be noted the drawings depict biasing resistors associated with cell 16 that are not essential to the understanding of the present invention, and are included to properly set the bias of transistors 36' and 34', as is understood in the art). The gate of switch 36' is coupled to the OPEN bit signal line from register 12. The drain of switch 36' is coupled to gate of switch 34' and to the source of switch 34'. The gate of switch 34' is coupled to ground GND, through Fuse_freeze, and to the input of inverter 44. In parallel with switch 34' is current source 32', having similar properties as current source 32, described above. During the test and set operations, OPEN bit signal line is held LOW, thus, switches 34' and 36' are in non-conducting states. Hence the input of inverter 44 is LOW, and it's output is HIGH, thereby placing transfer gates 38 in conducting states. Once the fuses are set (described above) it is preferable to isolate the test cells 14A–14E, as follows. Controller 62 commands controller 42 to change the OPEN bit in register 12 from LOW to HIGH. At this time, switches 34' and 36' are conducting, and Fuse_freeze 46 is blown, thereby isolating the transistors 34' and 36'. Since the current source 32' is in parallel with switch 34', it controls the input to the inverter 44.

In FIG. 4, the result of this operation is depicted. The input to inverter 44 is current source 32'. The inverter preferably comprises sufficient input impedance to effectively raise the input to HIGH, via current source 32', and thus, the output signal 40 is low. Thus, all the transfer gates 38 are OFF, thereby isolating the register 12 from the test cells 14A–14E. Since the test cells are isolated, the values generated by each OR gate remain fixed, as set by the test and set procedures described above. Note that, if a set bit is 0 for a particular cell (in this example, cells 14A, 14B and 14C) the current source 32 is couple to ground via the unblown fuse (e.g., Fuse_sign, Fuse_0, and Fuse_1). Thus, VDD (coupled to the current source) has no effect on the circuit and will not generate a HIGH value input into the OR gate. Those skilled in the art will recognize that the input impedance of the OR gate is orders of magnitude higher than the resistance of the fuse. Thus, the current from the current source flows to ground through the fuse and does not register as a HIGH input into the OR gate. Conversely, if a fuse has been blown (in this example, as shown in test cells 14D and 14E). The current source is coupled only to the input of the OR gate. Likewise, VDD is coupled to the OR gate via the current source. Thus, the input into the OR gate remains permanently HIGH. Thus, the trim current, Itrim, generated by the current DAC is permanently set by these inputs from the OR gates of each test cell. Thus, as shown in FIG. 4, register 12 is completely isolated from the test cells 14A–14E and the OPEN cell 16, and may thus be used by the IC for other purposes. Moreover, package pins VDD 28, VREF 20, I/O pins 22, 24 and GND 26 are freed for use by users of the IC.

Figure 5C:
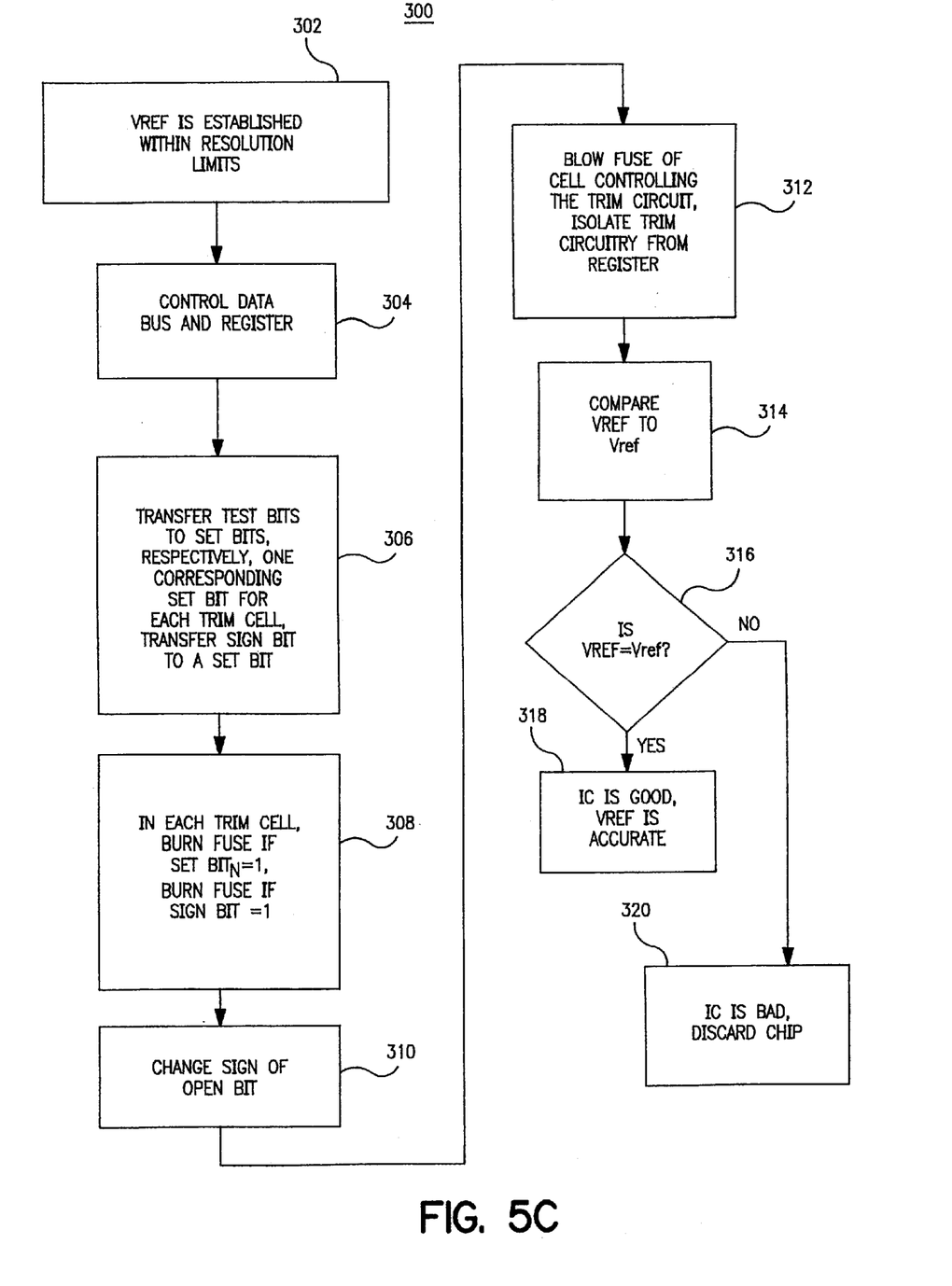

FIG. 5c depicts a flowchart 300 for the preferred method of setting the trim value (Vtrim) and isolating the trim circuitry from the register. For clarity, those components set forth in FIGS. 1–4 (i.e., test interface 50 including comparator 52 and high precision reference signal generator 54, and the trim components associated with the IC 10 including the trim cells 14A–14E, isolation cell 16, register 12 and transfer gates) will be referred to below without reference numerals. As set out above with reference to FIGS. 1–3 and 5B, Vref (V0+Vtrim) have been established to within the resolution limits 302. The test interface again controls the data bus and register 304 to begin the isolation procedure and trim voltage setting procedure. In the register, each of the test bits are transferred to the set bits, respectively, and the sign bit is likewise transferred to a set bit, each set bit corresponding to one trim cell 306. In each trim cell, circuitry is provided to burn a fuse (associated with that trim cell) if the set bit=1, including the transferred set bit of the sign bit 308. The test interface controls the register to change the sign of the OPEN bit 310, thereby changing the state of the cell controlling access to the trim circuitry. By changing the sign of the OPEN bit, a fuse is blown in the cell controlling the trim circuitry, thereby isolating the trim circuitry (i.e., trim cells) from the register 312. The test interface again compares VREF to Vref 314. If VREF=Vref 316 within 1LSB accuracy, the IC is deemed operable, and VREF is accurate 318. If VREF does not equal Vref within 1LSB accuracy, the IC is deemed bad, in which case an accurate VREF signal cannot be obtained, and the chip is discarded 320.

In operation, the test bit (T) is directly coupled to the OR gate (via transfer gate 38, described below). Likewise, the above described arrangement of the transistors ensures that if the set bit is 0, the OR gate 30 preferably has two inputs: a test input and a set input. In the embodiment shown in the figures, the test input, T (generated by register 12) passes through the test cell to the input of the OR gate.

Thus, it is evident that there has been provided an after package trim circuit and method that satisfies the aims and objectives stated herein. Those skilled in the art will recognize numerous modifications that can be made to the present invention. For example, although the detailed description sets fourth an exemplary bit-depth of 4 bits, it is to be understood that any bit depth can be chosen, depending on the desired resolution. To that end, the additional trim cells 14A–14E would need to be provided if a greater resolution is desired. Of course, those skilled in the art will recognize that the resolution limits may depend on the size of the IC register 12 (although it is equally contemplated that more than one register can be utilized for the present invention).

Other modifications are possible. For example, the transistors MN 36 and MP 34 are described herein generically as general MOS transistors, but could equivalently be replaced with BJT transistors, and/or other switches known in the art. Likewise, the current DAC 18 is preferably a generic current DAC having inputs as shown, which generates a proportional current Itrim. It should be noted that it is assumed herein that the DAC generates a current Itrim that is linearly proportional to the bit value inputs. Alternatively, the DAC can be configured to generated a nonlinear (e.g., geometric, exponential, logarithmic, etc.) and/or weighted current value based on the inputs. The current source 32 is depicted as a dependant current source, dependant upon the voltage rail VDD. Since the current source is directly couple to the fuse, it is assumed that the nominal output is insufficient to blow the fuse, but rather provides a conduction path to ground. It is further assumed that only a direct coupling between the voltage rail and the fuse (via switch 34) is sufficient to blow the fuse. However, those skilled in the art will recognize that this configuration can be modified using additional circuitry, yet generating the same result. All such modifications are deemed covered herein Still other modifications are possible. For example, the test interface 50 disclosed herein can be provided as a separate board, having an appropriately adapted temporary IC chip holder with the pinouts for VDD, GND, VREF and the I/O bus lines, as shown. Alternatively, the test interface can include a separate portable hand-held device having the disclosed functionality, and having attachment means (e.g., cables, clips, etc.) to interface with the IC 10.

Other modifications will become apparent to those skilled in the art. For example, it is assumed to a large extend that the components provided herein are of a generic nature, but that any of these components can be replaced with other conventional or proprietary circuit components known in the art. All such modifications are deemed within the spirit and scope of the present invention, as defined by the appended claims.

What is claimed is:

1. A programmable after-package, on-chip reference voltage trim circuit for an IC, said programmable trim circuit comprising: a register being controlled to generate a sequence of test bit signal and a sequence of set bit signals; a plurality of after package programmable trim cell circuits selectively coupled to said register, each said cell receiving a test bit signal and set bit signal from said register, said after package trim cells being adapted to generate an output signal equal to said test bit signal or said set bit signal, respectively, supplied to each after package trim cell; and a digital to analog converter (DAC) circuit coupled to said output signals and generating a trim current signal proportional to said output signals; a resistor to convert the trim current into a trim voltage signal, said trim voltage being added to an initial value of a reference voltage generated by said IC.

2. A trim circuit as claimed in claim 1, said trim circuit further comprising an isolation trim cell operable with a plurality of transfer switches disposed between said register and said trim cell circuits and receiving said test bit signals and set bit signals from said register and supplying said test bit signals and set bit signals to said trim cells, said transfer switches being controlled by said isolation trim cell to couple and uncouple said register from said trim cell circuits upon receiving an open bit or a close bit from said register, respectively.

3. A trim circuit as claimed in claim 1, wherein each trim cell circuit comprises:

an OR gate having a first input and a second input, said second input being selectively coupled to said test bit signal; and a set circuit portion including a first switch having a control node selectively coupled to said set bit signal and a conduction node, a second switch having a control node coupled to said conduction node of said first switch, an active node coupled to a common voltage rail supplied by said IC and a conduction node coupled to said first input of said OR gate, and a nominal current source in parallel with said second switch and connected to said first input of said OR gate and said voltage rail, and a fuse coupled between a ground potential rail supplied by said IC and said first input of said OR gate; wherein said set bit signal controlling the conduction state of said first and second switches, and the input value of said first input of said OR gate.

4. A trim circuit as claimed in claim 3, wherein if said set bit is high, both said first and second switches conduct and a conduction path between said voltage rail and ground is established through said fuse causing said fuse to break, and said voltage rail being permanently coupled to said first input of said OR gate; and wherein if said set bit is low, both said first and second switches do not conduct and said fuse remains intact, and a conduction path is established between said voltage rail and ground through said fuse and said current source thereby generating a low input to said first input of said OR gate.

5. A trim circuit as claimed in claim 2, wherein said isolation trim cell comprising:

an inverter circuit having an input, and an output coupled to a control node of said isolation switches and supplying a signal thereto to determine a conduction state of said isolation switches; and an isolation circuit portion including a first switch having a control node selectively coupled to an isolation bit signal generated by said register and a conduction node, a second switch having a control node coupled to said conduction node of said first switch, an active node coupled to a common voltage rail supplied by said IC and a conduction node coupled to said input of said inverter circuit, and a nominal current source in parallel with said second switch and connected to said input of said inverter circuit and said voltage rail, and a fuse coupled between a ground potential rail supplied by said IC and said input of said inverter circuit; wherein said isolation bit signal controlling the conduction state of said first and second switches, and the input value of said input of said inverter circuit.

6. A trim circuit as claimed in claim 5, wherein if said isolation bit signal low, the output of said inverter is high; and if said isolation bit signal is high, both said first and second switches conduct and a conduction path between said voltage rail and ground is established through said fuse causing said fuse to break, and said voltage rail being permanently coupled to said input of said inverter circuit thereby permanently generating a low value output from said inverter and thereby causing said isolation switches to be in a non-conducting state, thereby decoupling said register from said trim cells.

7. A trim circuit as claimed in claim 1, further comprising a bus controller controlling said register to generate said set bit signals and said test bit signals.

8. A trim circuit as claimed in claim 3, wherein one of said trim cell circuits including a sign cell circuit and being supplied a set and test bit indicative of said control signal and generating a bit value to said DAC indicative of a desired sign of said trim current.

9. A method of trimming a reference voltage for an integrated circuit, said method comprising the steps of:

measuring an initial value of a reference voltage signal generated by said IC;

comparing said initial value signal to a high precision reference signal;

generating a control signal indicative of the sign of difference between said initial value signal and said high precision signal;

controlling a plurality of after package trim cell circuits to generate a bit sequence indicative of a sign and magnitude of a trim current;

generating a trim current having a sign and value proportional to said bit sequence;

generating a trim voltage on a resistor placed between trim current generator and IC voltage reference;

adding said trim voltage to said voltage reference value and determining if said added signals approximately equal said high precision reference signal; and permanently setting said bit values generated by said after package trim cells when said added signals equal said high precision reference signal.

10. A method as claimed in claim 9, further comprising the step of isolating said trim cells from said IC after said step of permanently setting said bit values.

11. A method as claimed in claim 10, further comprising the step of controlling a register to generate said sequence of bit values and a sign bit based on said control signal.

12. A method as claimed in claim 10, further comprising the step of converting said bit sequence value to a proportional analog trim current.

13. A method as claimed in claim 10, further comprising the step of converting said trim current into a trim voltage with sign and value proportional with trim current value.

14. A trim circuit as claimed in claim 3, wherein said nominal current source being a dependant current source dependant upon said voltage rail value, and generating a current value smaller than a rating of said fuse.

15. A trim circuit as claimed in claim 3, wherein said fuse having a rating sufficient to be broken by said common voltage rail.

16. A trim circuit as claimed in claim 3, wherein said OR gate having an input impedance greater than the impedance of said fuse.

* * * * *

UNITED STATES PATENT AND TRADEMARK OFFICE
CERTIFICATE OF CORRECTION

PATENT NO.    : 6,472,897 B1
DATED         : October 29, 2002
INVENTOR(S)   : You-Yuh Shyr and Sorin Laurentiu Negru It is certified that error appears in the above-identified patent and that said Letters Patent is hereby corrected as shown below:

<u>Title page,</u>
Item [73], Assignee, please replace "Micro" with -- O2Micro --.

Signed and Sealed this

Twenty-ninth Day of April, 2003

JAMES E. ROGAN
*Director of the United States Patent and Trademark Office*